United States Patent
Kawakami et al.

[11] Patent Number: 5,929,482
[45] Date of Patent: Jul. 27, 1999

[54] POWER SEMICONDUCTOR DEVICE AND METHOD FOR MANUFACTURING THE SAME

[75] Inventors: Minoru Kawakami; Mitsuhiro Yano; Yasunori Yamashita, all of Tokyo; Hidetoshi Souno, Hyogo, all of Japan

[73] Assignees: Mitsubishi Denki Kabushiki Kaisha, Tokyo; Ryoden Semiconductor System Engineering Corporation, Itami, both of Japan

[21] Appl. No.: 09/061,056

[22] Filed: Apr. 16, 1998

[30] Foreign Application Priority Data

Oct. 31, 1997 [JP] Japan ............................... P09-300683

[51] Int. Cl.⁶ .................................................. H01L 21/324
[52] U.S. Cl. .......................... 257/328; 257/329; 257/330; 257/331; 257/332; 257/333; 257/334; 257/340
[58] Field of Search ..................... 257/329, 328, 257/341, 330, 331, 332, 333, 334

[56] References Cited

U.S. PATENT DOCUMENTS

| | | | |
|---|---|---|---|
| 4,236,166 | 11/1980 | Cho et al. | 357/22 |
| 4,771,013 | 9/1988 | Curran | 437/31 |
| 5,015,593 | 5/1991 | Yawata et al. | 437/25 |
| 5,308,789 | 5/1994 | Yoshimura et al. | 437/141 |

FOREIGN PATENT DOCUMENTS 57-5364 1/1982 Japan.
61-3415 1/1986 Japan.

*Primary Examiner*—William Mintel
*Attorney, Agent, or Firm*—Oblon, Spivak, McClelland, Maier & Neustadt, P.C.

[57] ABSTRACT

An $n^+$ semiconductor substrate (1) using a silicon wafer as a base material and including As includes oxygen of which the concentration is in the range of 12E17 atoms/cm³ to 20E17 atoms/cm³. The first epitaxial growth layer (2) of n type and a diffusion layer (3) of p type are formed in sequence on the second major surface (1S2) of the semiconductor substrate (1). The thickness of an epitaxial a growth layer (10) is set to be not more than 20 μm. A trench (6) is formed so as to extend from a surface of the diffusion layer (3) to the inside of the first epitaxial growth layer (2). A gate oxide film (5) is formed on a bottom surface (6B) and a wall surface (6W) of the trench (6) and a conductive layer (11) fills the trench (6). An n-type source layer (4) is formed at a corner (6C) of the trench (6). After that, predetermined electrodes are formed and so on, to complete a device. With this structure, it is possible to reduce a leak current, prevent deterioration in main breakdown voltage and stabilize gate-oxide-film breakdown-voltage characteristics in a vertical MOSFET with trench gate.

9 Claims, 13 Drawing Sheets

POWER SEMICONDUCTOR DEVICE AND METHOD FOR MANUFACTURING THE SAME

BACKGROUND OF THE INVENTION

1. Field of the Invention

The present invention relates to a power semiconductor device and a method for manufacturing the same, and more particularly to a technique for suppressing a leak current to improve electric characteristics such as a main breakdown voltage and a gate-oxide-film breakdown voltage in a power semiconductor device such as a diode and a power MOSFET.

2. Description of the Background Art

In power semiconductor devices such as vertical power MOSFETs and horizontal power MOSFETs, where high voltage is applied and large current flows. These devices generally include a semiconductor substrate having a surface epitaxial growth layer having a transistor formed inside.

FIG. 14 is a cross section showing a background-art structure of a vertical MOSFET with trench gate as an example of the power semiconductor device.

As shown in FIG. 14, an epitaxial growth layer 102 having an n-type impurity and a diffusion layer 103 having a p-type impurity are formed in sequence on a surface of a $n^+$ semiconductor substrate 101.

Further, a trench which is deeper than a film thickness of the p-type diffusion layer 103 is formed, extending from a surface of the p-type diffusion layer 103 to the inside of the n-type epitaxial growth layer 102. A source layer 104 having an n-type impurity is formed in a predetermined region of the p-type diffusion layer 103 at an opening corner of the trench, and an oxide film 105 serving as a gate oxide film is formed on a wall surface and a bottom surface inside the trench. Further, the trench is filled with a trench buried layer 110 and the trench buried layer 110 is connected to a gate electrode not shown. An interlayer insulating layer 109 is formed so as to cover an upper surface of the trench buried layer 110 and the gate oxide film 105 near the opening corner of the trench. A source electrode 108 is formed so as to cover the interlayer insulating layer 109 and an exposed surface of the p-type diffusion layer 103.

Next, an operation of the background-art vertical MOSFET of FIG. 14 will be discussed.

First, a positive (forward) drain voltage Vds is applied across a drain electrode 107 and the source electrode 108 by an external power supply. In this state, a positive (forward) gate voltage which exceeds a predetermined gate threshold voltage is applied across the gate electrode not shown and the source electrode 108. At this time, electrons are induced in a region near an interface between the p-type diffusion layer 103 and the gate oxide film 105, to form an n-type channel region. With this channel region, the n-type source layer 104 and the n-type epitaxial growth layer 102 become conducting, and an electronic current flowing in from an external circuit side not shown through the source electrode 108 further flows through the n-type source layer 104, the above channel region in the p-type diffusion layer 103, the n-type epitaxial growth layer 102 and the n-type semiconductor substrate 101 to the drain electrode 107, whereby the device comes into an ON state.

Subsequently, when the gate electrode is changed into a voltage lower than the above gate threshold voltage (reversely biased), the channel region which was inverted into n-type returns to p-type layer to break the above current path, whereby the device comes into an OFF state.

The main breakdown voltage of the power semiconductor device having a vertical MOSFET structure with trench gate depends on the resistivity and the thickness of the epitaxial growth layer. Specifically, when the drain voltage rises in the OFF state, a reverse voltage applied across a pn junction in the interface between the n-type epitaxial growth layer 102 and the p-type diffusion layer 103 rises and at this time a depletion layer in the pn junction extends across the n-type epitaxial growth layer 102 and the p-type diffusion layer 103 to hold the voltage. The breakdown voltage in the pn junction, i.e., the main breakdown voltage depends on an electric field in the depletion layer of the junction and is therefore closely related to the reverse voltage and the width of the depletion layer. Further, the width of the depletion layer depends on the respective impurity concentrations of the n-type epitaxial growth layer 102 and the p-type diffusion layer 103 and the resistivity also depends on the impurity concentration, and therefore the width of the depletion layer depends on the resistivity of the epitaxial growth layer. When the epitaxial growth layer does not have enough thickness relative to the extension of the depletion layer, it is impossible to determine large breakdown voltage in the pn junction. Therefore, the main breakdown voltage in the power semiconductor device having the above structure depends on the resistivity and the thickness of the epitaxial growth layer.

In the vertical MOSFET with trench gate of FIG. 14, (i) there occurs metal contamination in the semiconductor device due to some dust and the like from a manufacturing apparatus. Further, (ii) there occurs a crystal defect inside the epitaxial growth layer due to damages in both trench formation and formation of films such as an $SiO_2$ film and further due to damage in wafer processing such as dry etching and the like. The metal contamination and the crystal defect cause the following problems.

① First, the crystal defect of (ii) forms a deep energy level between energy bandgaps of the epitaxial growth layer resulting in a leak current produced by recombination. Also the impurities of heavy metals such as Fe and Cu of (i) are trapped by the above crystal defect, to cause the leak current. In other words, there arises a problem of increasing the leak current between the drain and source as indicated by a curve α in FIG. 15 due to the above causes.

② Moreover, generation of the leak current means deterioration in reverse bias characteristics, such that if the leak current greatly increases, the main breakdown voltage decreases as indicated by a curve β in FIG. 15, causing a problem that desired electric characteristics can not be obtained.

③ The above-noted crystal defect is likely to appear near the interface between the gate oxide film inside the trench and the epitaxial growth layer in the manufacturing process. Therefore, a stress is likely to be generated near the interface, and distortion due to the stress causes deterioration in insulativeness of the gate oxide film. The deterioration in film quality (insulativeness) of the gate oxide film lowers the range of voltage applicable to the gate oxide film (deterioration in gate-oxide-film breakdown-voltage characteristics) as shown in FIG. 16, and, again, the desired electric characteristics can not be obtained.

Suppressing the above problem sources (i) and (ii) which causes the problems ① to ③ is strongly required in the technical field of the vertical MOSFET.

These problems are not limited to the technical field of the vertical MOSFET. Specifically, also in a diode, a thyristor having the pn junction and the like, through the junction face reversely biased by the above problem sources (i) and (ii), ① the leak current is generated in a bulk and ② when the leak current is of a high value, the main breakdown voltage is deteriorated. Further, also in the vertical MOSFET with plane gate, the problems ① and ② are caused, and the problem sources (i) and (ii) must be resolved. In other words, power semiconductor devices are prone to problems caused by problem sources (i) and (ii) which must be resolved to ensure the desired electric characteristics.

On the other hand, prior art attempts at removing the crystal defect problems are disclosed relative to a horizontal MOSFET in a CMOS device. See, for example Japanese Patent Application Laid Open Gazette 57-5364. The technique in this document relates to a MOS integrated circuit device having a silicon monocrystalline substrate, and an appropriate range of oxygen concentration is specified from a relation between an oxygen concentration of the substrate and a leak-current characteristic failure rate of the MOS integrated circuit.

In a technique disclosed in Japanese Patent Application Laid Open Gazette 61-3415, an appropriate range of concentration of oxygen and carbon in the silicon substrate is specified to suppress electric characteristic failure such as the leak current and hold failure in a dynamic MOS memory.

It is noted that the problems ① to ③ pointed out by the present inventors relate to a power semiconductor device to control a bulk current as a main current. In this power semiconductor device, it is considered that the bulk has a great effect on the main current, and without this consideration, it seems impossible to overcome all the problems ① to ③. In these prior-art documents, the appropriate oxygen concentration is specified in the integrated circuit device having a structure where an integrated circuit is formed in a silicon substrate surface and a surface current flows only in the substrate surface, i.e., a horizontal (planar) MOS structure, and no teaching or suggestion is made to the effect of the bulk on characteristics. Therefore, it is not believed that the prior-art documents can be adopted to solve the above problems ① to ③.

Thus, proposing a new structure to overcome the problems ① to ③ in the power semiconductor device is an urgent matter.

SUMMARY OF THE INVENTION

The present invention is directed to a power semiconductor device. According to a first aspect of the present invention, the power semiconductor device comprises: a semiconductor substrate comprising an impurity of a first conductivity type and oxygen; an epitaxial growth layer comprising a first major surface being a first interface with a major surface of the semiconductor substrate and a second major surface opposed to the first major surface; and a semiconductor layer of a second conductivity type comprising a third major surface being a second interface with the second major surface of the epitaxial growth layer and a fourth major surface opposed to the third major surface, wherein the concentration of the oxygen is set to be not less than 12E17 atoms/cm$^3$.

According to a second aspect of the present invention, the power semiconductor device of the first aspect further comprises: a trench formed so as to extend from the fourth major surface of the semiconductor layer through the second interface to the inside of the epitaxial growth layer; and an oxide film formed entirely on a bottom surface and a wall surface of the trench.

According to a third aspect of the present invention, in the power semiconductor device of the second aspect, the concentration of the oxygen is set to be not more than 20E17 atoms/cm$^3$.

According to a fourth aspect of the present invention, in the power semiconductor device of the second aspect, an upper limit of the concentration of the oxygen is specified so that the resistivity of the semiconductor substrate may be not more than 0.006 Ω.cm.

According to a fifth aspect of the present invention, in the power semiconductor device of the first aspect, the impurity in the semiconductor substrate is As.

According to a sixth aspect of the present invention, in the power semiconductor device of the first aspect, a sum of the thickness of the epitaxial growth layer and the thickness of the semiconductor layer is set to be not more than 20 μm.

According to seventh and eighth aspects of the present invention, in the power semiconductor device of the first aspect, the semiconductor substrate comprises a silicon wafer as base material comprising an orientation flat, a surface of the silicon wafer is the major surface of the semiconductor substrate, the orientation flat has a normal direction which is one of crystal axes perpendicular to a crystal axis in a normal direction of the surface of the silicon wafer, and a longitudinal direction of the trench is parallel to or perpendicular to the normal direction of the orientation flat.

According to a ninth aspect of the present invention, a power semiconductor device comprises: a semiconductor substrate comprising arsenic and oxygen as impurities; an epitaxial growth layer formed on a major surface of the semiconductor substrate and having a thickness of not more than 20 μm; a trench formed so as to extend from a surface of the epitaxial growth layer to the inside thereof; and an oxide film formed entirely on a bottom surface and a wall surface of the trench, wherein the epitaxial growth layer comprises a first epitaxial growth layer of a first conductivity type formed on the major surface of the semiconductor substrate; and a diffusion layer of a second conductivity type formed to be diffused in the first epitaxial growth layer, and the concentration of the oxygen is set so that a resistivity of the semiconductor substrate is in a range of 0.002 Ω.cm to 0.006 Ω.cm.

The present invention is also directed to a method for manufacturing a power semiconductor device. According to a tenth aspect of the present invention, the method comprises: a first step of providing a semiconductor substrate of a first conductivity type comprising oxygen having a concentration of not less than 12E17 atoms/cm$^3$; a second step of forming an epitaxial growth layer of the first conductivity type on a major surface of the semiconductor substrate; a third step of forming an impurity layer of a second conductivity type so as to extend from a surface of the epitaxial growth layer towards the inside thereof to provide a first epitaxial growth layer of the first conductivity type and a diffusion layer of the second conductivity type; and a fourth step of forming a film on a surface of the diffusion layer.

According to an eleventh aspect of the present invention, in the method of the tenth aspect, the third step comprises the steps of: forming a trench so as to extend from the surface of the diffusion layer to the inside of the first epitaxial growth layer; and forming an oxide film entirely on a bottom surface and a wall surface of the trench and further forming a conductive layer on a surface of the oxide film to fill the trench with the conductive layer.

According to a twelfth aspect of the present invention, in the method of the eleventh aspect, the concentration of the oxygen is set to be not more than 20E17 atoms/cm$^3$.

According to a thirteenth aspect of the present invention, in the method of the twelfth aspect, the thickness of the epitaxitial growth layer is set to be not more than 20 μm.

According to fourteenth and fifteenth aspects of the present invention, in the method of the eleventh aspect, the first step comprises the step of: providing a silicon wafer comprising an orientation flat as base material of the semiconductor substrate, and the orientation flat has a normal direction which is one of crystal axes perpendicular to a crystal axis in a normal direction of the surface of the silicon wafer, and a longitudinal direction of the trench is parallel to or perpendicular to the normal direction of the orientation flat.

(1) In the semiconductor device of the first aspect, since the diffusion layer of the second conductivity type and the first epitaxial growth layer of the first conductivity type make a pn junction and the first epitaxial growth layer is formed on the major surface of the semiconductor substrate of the first conductivity type, when a reverse bias voltage less than the breakdown voltage (main breakdown voltage) is applied across the diffusion layer and the semiconductor substrate, no current flows in the bulk consisting of the semiconductor substrate, the first epitaxial growth layer and the diffusion layer. In the epitaxial growth layer, however, there occur (i) metal contamination due to some dust and the like from the manufacturing apparatus and (ii) a crystal defect caused by damages due to dry etching and the like, which become a source of leak current, during the process of manufacturing the power semiconductor device. Specifically, when the crystal defect occurs in the bulk, i.e., in the epitaxial growth layer as (i), the crystal defect causes a deep energy level between energy bandgaps, thereby producing a leak current by recombination. Moreover, when heavy metals such as Fe and Cu are encroached in the epitaxial growth layer as (i), the impurities are trapped by the crystal defect, to produce the leak current. Therefore, ① the leak current is produced between the semiconductor substrate and the epitaxial growth layer, and the reverse-bias characteristics of the power semiconductor device having the pn junction is deteriorated since the leak current increases as the reverse bias voltage rises. Moreover, ② when the metal contamination and the crystal defect have great effects, the leak current greatly increases and therefore the main breakdown voltage disadvantageously drops. In the device of the first aspect, however, since oxygen is included in the semiconductor substrate, a crystal defect occurs in the semiconductor substrate. Therefore, the intrinsic gettering effect is produced due to the crystal defect in the semiconductor substrate, thereby reducing the metal contamination and the crystal defect in the epitaxial growth layer which are the sources of leak current. Since the crystal defect is produced in the semiconductor substrate in proportion to the oxygen concentration, however, when the oxygen concentration is relatively low, the precipitation of $O_2$ nucleus in the semiconductor substrate decreases and the intrinsic gettering effect is lowered. In the device of the first aspect, since the oxygen concentration is set to be not less than 12E17 atoms/cm$^3$, the amount of precipitation of $O_2$ nucleus in the semiconductor substrate is made optimum to prevent the intrinsic gettering effect from being lowered. Therefore, with these optimum gettering effect, the crystal defect and the like in the epitaxial growth layer effectively decreases and the leak current is greatly reduced by suppressing its generation, to thereby prevent deterioration in breakdown voltage.

(2) In the power semiconductor device of the second aspect, since the trench structure is formed in the epitaxial growth layer, there arises a new problem that the crystal defect easily occurs in the interface between the oxide film and the epitaxial growth layer and when strong stress is applied to the interface, the film quality (insulativeness) of the oxide film is deteriorated. That further causes a problem that when the oxide film is used as the trench-gate oxide film of the vertical MOSFET, the gate-oxide-film breakdown-voltage characteristics are deteriorated. In the power semiconductor device of the present invention, however, since the oxygen concentration in the semiconductor substrate is set to be not less than 12E17 atoms/cm$^3$, the amount of crystal defect in the semiconductor substrate is controlled to be optimum and the intrinsic gettering effect is well exerted to fully reduce the crystal defect near the interface between the oxide film and the epitaxial growth layer and greatly increase the breakdown voltage of the gate oxide film.

In the power semiconductor device of the third aspect, the oxygen concentration in the semiconductor substrate is controlled to be in the range of 12E17 atoms/cm$^3$ to 20E17 atoms/cm$^3$. Therefore, the intrinsic gettering effect can be fully exerted by using the crystal defect in the semiconductor substrate and the crystal defect and the like in the bulk of the epitaxial growth layer and the crystal defect near the interface between the oxide film and the epitaxial growth layer can be greatly reduced, to achieve an improvement in leak-current failure rate and oxide-film breakdown voltage. Moreover, in the device of the present invention, since the resistivity of the semiconductor substrate can be controlled to be not more than 0.006 Ω cm, it is possible to control the ON-resistance to be in an appropriate predetermined range at the same time by suppressing an increase in ON-resistance of the device caused by the increase in resistivity. Specifically, since the concentration of the impurity of the first conductivity type in the semiconductor substrate decreases though the intrinsic gettering effect increases as the oxygen concentration increases, there clearly arises a problem that the resistance of the semiconductor substrate increases and the ON-resistance related to the current flowing in the bulk conversely increases. In the present invention, since the appropriate upper limit of the oxygen concentration is specified, the intrinsic gettering effect can be fully exerted while preventing the increase in resistance of the semiconductor substrate.

(4) In the power semiconductor device of the fourth aspect, since the oxygen concentration in the semiconductor substrate is controlled so that the resistivity of the semiconductor substrate may be not more than 0.006 Ω cm, the crystal defect is effectively generated in the semiconductor substrate and the intrinsic gettering effect can be fully exerted in a power device such as the vertical MOSFET while ensuring the semiconductor substrate is of extremely low resistance.

(5) In the power semiconductor device of the fifth aspect, since As (arsenic) suitable for practical use is used as an impurity, a semiconductor substrate whose resistivity is in the range of 0.002 Ω cm to 0.006 Ω cm can be achieved.

(6) In the power semiconductor device of the sixth aspect, since the thickness of the epitaxial growth layer is set to be not more than 20 μm, the ratio of the bulk resistance in the epitaxial growth layer to the resistance of the whole device is greatly reduced, so that the resistance value of the whole device can be determined by using the channel resistance. Therefore, the advantage of the trench structure over the plane crate structure that the ON-resistance is further lowered can be fully taken.

(7) In the power semiconductor device of the seventh and eighth aspects, since the relation between the crystal orientation of the orientation flat of the silicon wafer which is the base material of the semiconductor substrate and the longitudinal direction of the trench is appropriately determined, it is possible to obtain a uniform thickness of the oxide films formed on the wall surface and the bottom surface of the trench and improve the breakdown-voltage characteristics of the oxide film.

(8) In the power semiconductor device of the ninth aspect, i) the advantage of the trench gate structure can be fully taken, and ii) the intrinsic gettering effect can be fully exerted while ensuring the semiconductor substrate of extremely low resistance, the increase in the ON-resistance in the power semiconductor device is prevented and the leak-current failure rate in the power semiconductor device is improved, to prevent the breakdown voltage from decreasing and improve the oxide-film breakdown-voltage characteristics.

(9) In the method of the tenth aspect, since the intrinsic gettering effect is fully accelerated through the second to fourth steps, the same effect as the first aspect is achieved. In the method of the eleventh aspect, the same effect as the second aspect is achieved. In the method of the twelfth aspect, the same effect as the third aspect is achieved. In the method of the thirteenth aspect, the same effect as the sixth aspect is achieved. In the method of the fourteenth and fifteenth aspects, the same effect as the seventh and eighth aspects is achieved.

The first object of the present invention is to sufficiently reduce the leak current which might be generated inside the epitaxial growth layer by suppressing the metal contamination and crystal defect inside the epitaxial growth layer, and thereby provide a new structure of a semiconductor device which prevents deterioration of the main breakdown voltage.

The second object of the present invention is to stabilize the oxide-film breakdown-voltage characteristics, along with achievement of the first object, in the semiconductor device with trench gate.

The third object of the present invention is to provide a structure to take a full advantage of the trench gate structure in the semiconductor device with trench gate.

The fourth object of the present invention is to improve the breakdown-voltage characteristics of the oxide film in the trench gate structure from the relation with the base material of the semiconductor substrate.

The fifth object of the present invention is to provide a manufacturing method suitable for the above semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

The First Preferred Embodiment

Figure 1:
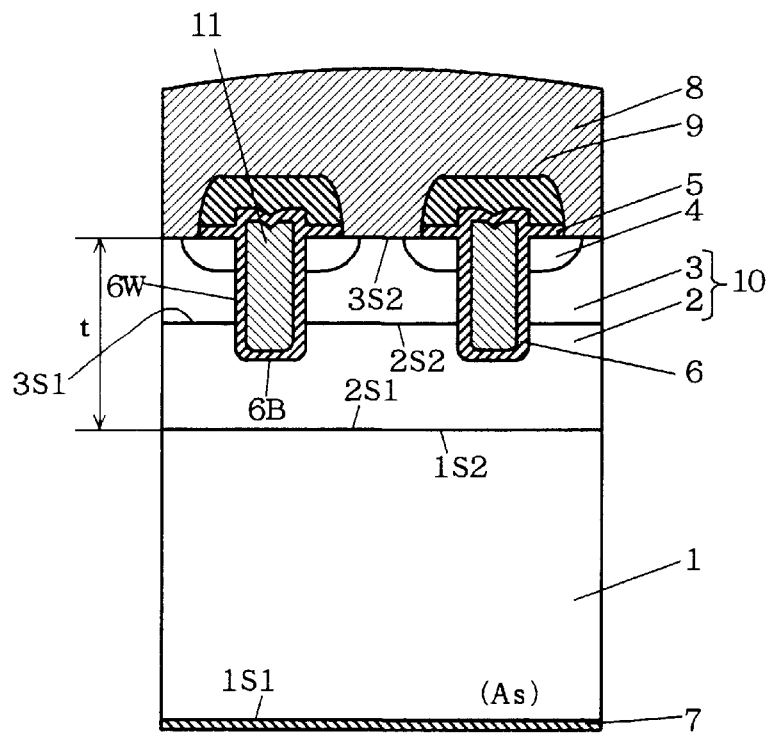
FIG. 1 is a cross section showing a structure of a vertical MOSFET with trench gate in accordance with a first preferred embodiment of the present invention.

FIG. 1 is a cross section showing a structure of a vertical MOSFET with trench gate as an example of a power semiconductor device in accordance with the first preferred embodiment of the present invention.

In FIG. 1, an $n^+$ semiconductor substrate 1 whose base material is silicon wafer includes an impurity of the first conductivity type and oxygen. The impurity of the first conductivity type included in the semiconductor substrate 1 is As and the concentration of As is higher than that of an impurity in the first epitaxial growth layer as discussed later. The concentration of the oxygen included in the semiconductor substrate 1 as an impurity is limited to a range of 12E17 atoms/cm$^3$ to 20E17 atoms/cm$^3$. The reason why the oxygen concentration is limited to this range will be discussed later with reference to FIGS. 2 to 5. A drain electrode 7 is formed on the first major surface 1S1 of the semiconductor substrate 1 and an epitaxial growth layer 10 is formed by epitaxial growth on the second major surface 1S2 of the semiconductor substrate 1.

The epitaxial growth layer 10 consists of (i) the first epitaxial growth layer 2 of the first conductivity type including an impurity of the first conductivity type (n type) and (ii) a diffusion layer or a p-type channel layer 3 of the second conductivity type including an impurity of the second conductivity type (p type). In other words, the first major surface 2S1 of the first epitaxial growth layer 2 is the first interface with the second major surface 1S2 of the semiconductor substrate 1 while the second major surface 2S2 of the first epitaxial growth layer 2 opposed to the first major surface 2S1 is the second interface with the third major surface 3S1 of the diffusion layer 3.

Since the base material of the diffusion layer 3 is the epitaxial growth layer, the first epitaxial growth layer 2 and the diffusion layer 3 are generally defined as the epitaxial growth layer 10 herein. After formation of the diffusion layer 3, however, only the first epitaxial growth layer 2 is left as the epitaxial growth layer, and therefore the first epitaxial growth layer 2 may be simply termed "the epitaxial growth layer". Further, the diffusion layer 3 may be defined as "the semiconductor layer of the second conductivity type".

Further, the epitaxial growth layer 10 is opened from its surface towards its inside, to form a trench 6. Specifically, the trench 6 is formed so as to extend from the fourth major surface 3S2 of the diffusion layer 3 opposed to the third major surface 3S1 to the inside of the first epitaxial growth layer 2 across the second interface. A gate oxide film (hereinafter, referred to simply as oxide film) made of $SiO_2$ is formed entirely on a bottom surface 6B and a wall surface or a side surface 6W surrounding the bottom surface 6B of the trench 6. A source layer 4 which is an n-type impurity layer is formed from a portion of the diffusion layer 3 at an opening corner 6C of the trench 6, specifically, a portion of the fourth major surface 3S2 of the diffusion layer 3 which is the lip of the wall surface 6W of the trench 6 to the inside of the diffusion layer 3 along the wall surface 6W. A conductive layer, or a trench buried layer 11 is formed entirely on and over the oxide film 5 which is not in contact with the wall surface 6W to fill the trench 6. The conductive layer 11 is connected to a gate electrode not shown.

Further, an interlayer insulating film 9 is formed on the fourth major surface 3S2 of the diffusion layer 3 so as to cover the upper surface of the conductive layer 11 and the oxide film 5 near the corner 6C of the trench 6, and a source electrode 8 is formed on the other portion of the fourth major surface 3S2 so as to cover the interlayer insulating film 9.

The thickness of the epitaxial growth layer 10 is set to be not more than 20 $\mu$m as discussed later.

Figure 14:
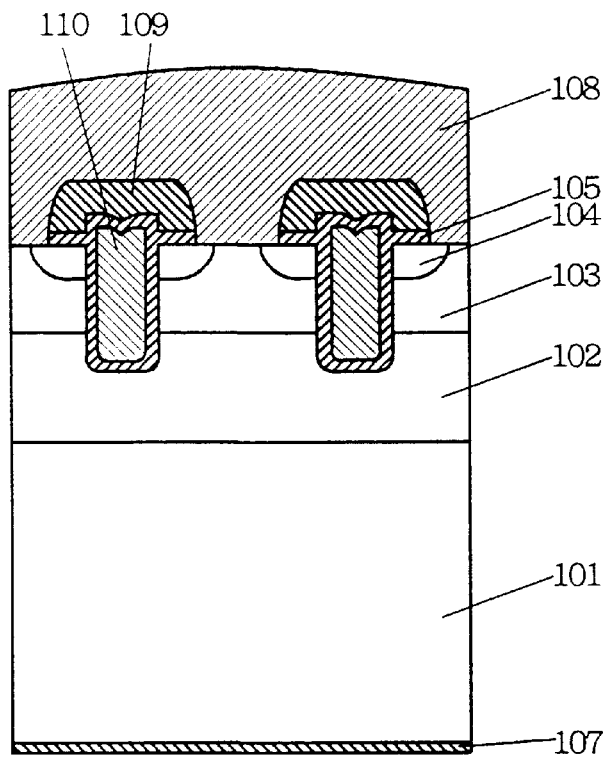
FIG. 14 is a cross section showing a step of manufacturing a vertical MOSFET with trench gate in the background art.
Figure 15:
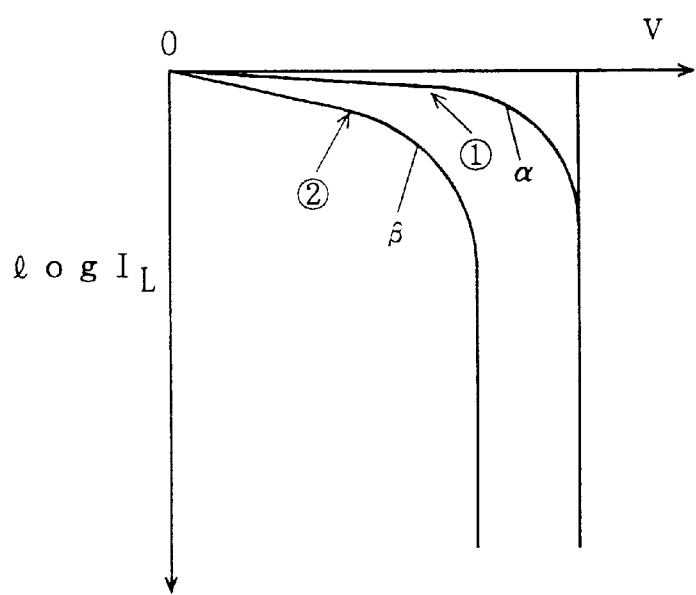
FIG. 15 shows a relation between a main breakdown voltage and a main current in the vertical MOSFET with trench gate.
Figure 16:
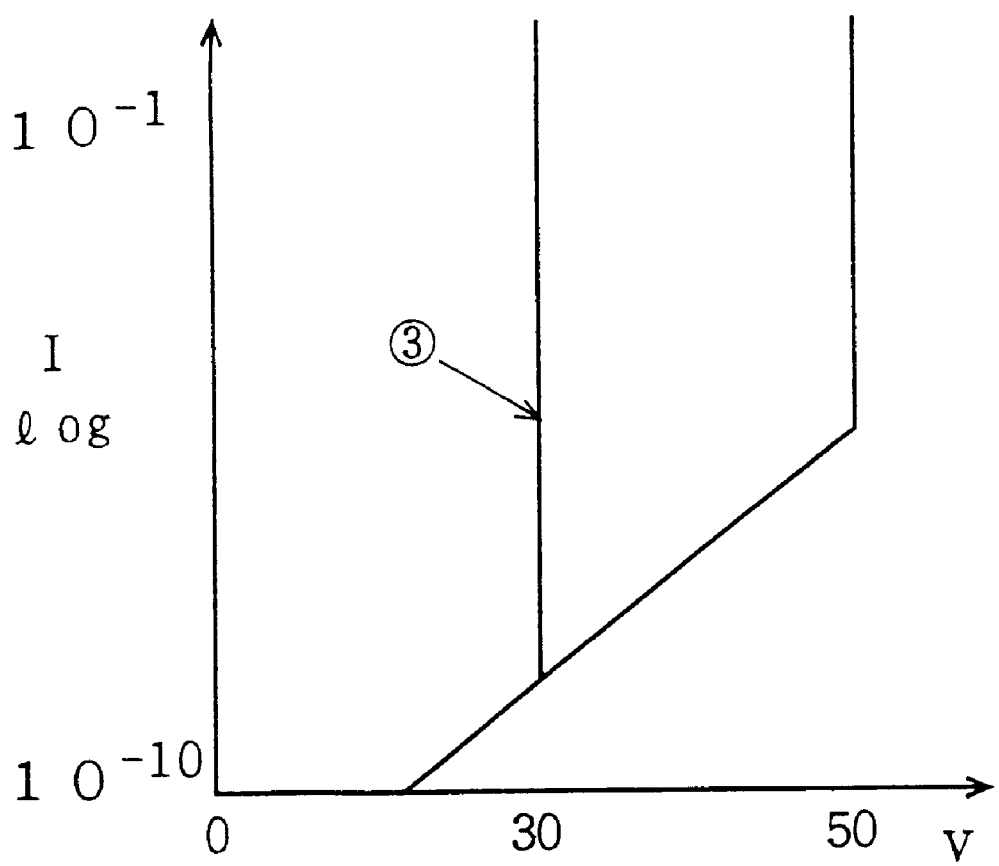
FIG. 16 shows insulation characteristics of the gate oxide film in the vertical MOSFET with trench gate.

The operation of the vertical power MOSFET having the above structure is the same as that of the device of FIG. 14. Specifically, in a state where a forward drain voltage is applied across the drain electrode 7 and the source electrode 8 (therefore the pn junction of the second interface is reversely-biased), when a gate voltage which exceeds the predetermined gate threshold voltage is applied to the gate electrode, carriers flow from an external circuit to the side of the drain electrode 7 through the source electrode 8, the source layer 4, the channel region inverted into n-type layer near the interface between the oxide film 5 and the diffusion layer 3, the first epitaxial growth layer 2 and the semiconductor substrate 1, thereby to place the device an ON state.

As described earlier, in the power semiconductor device, the metal contamination and the crystal defect are likely to be caused inside the epitaxial growth layer 10 due to damages of dry etching and the like in the wafer processing. It is well known that the problem sources, i.e., the metal contamination and the crystal defect inside the epitaxial growth layer 10 are reduced by the intrinsic gettering effect using the crystal defect formed inside the semiconductor substrate 1. Since the density of the crystal defect inside the semiconductor substrate 1 is in proportion to the oxygen concentration, when the oxygen concentration is relatively low, the intrinsic gettering effect which is caused by precipitation of $O_2$ nucleus inside the semiconductor substrate 1 becomes lower, to cause a leak current between the drain and source. When the leak current is too high, the main breakdown voltage also decreases.

Then, there arises a need for increasing the oxygen concentration, and since an ON-current flows in a bulk consisting of the first epitaxial growth layer 2 and the semiconductor substrate 1 in the present power semiconductor device, a further study from a different point of view from a horizontal MOSFET is required. Specifically, when the oxygen concentration is made too high, the resistance of the semiconductor substrate 1 increases to disadvantageously raise an ON-resistance of the device since the concentration of the impurity of the first conductivity type in the semiconductor substrate 1, i.e., As decreases when the oxygen concentration is high. Therefore, in the present power semiconductor device, it is necessary to derive a control range of the oxygen concentration to take full advantage of the intrinsic gettering effect in consideration of suppressing the increase in resistance of the semiconductor substrate 1 and the increase in ratio of the resistance of the first epitaxial growth layer 2 to that of the whole device. Based on the above consideration and viewpoint, the result of study by the inventors of the present invention on an optimum oxygen concentration in a power device such as a vertical MOSFET, is shown in the figures, on which discussion will be made below.

Figure 2:
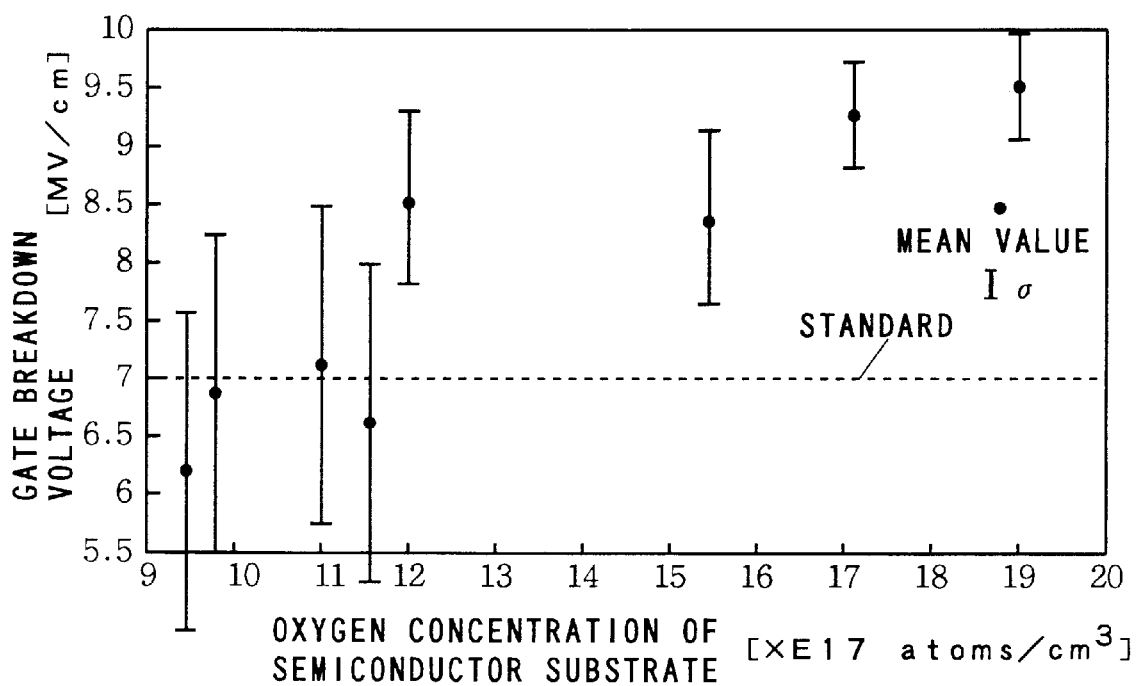
FIG. 2 shows a relation between an oxygen concentration and a breakdown voltage of a gate oxide film in a semiconductor substrate.

First, FIG. 2 shows an experimental result indicating a relation between the oxygen concentration (hereinafter, the oxygen concentration is represented by a sign Oi) in the semiconductor substrate 1 and the gate voltage.

This experiment is carried out as follows. The result of FIG. 2 indicates a condition of the oxygen concentration Oi to solve the problem ③ among the above-mentioned problems. Specifically, discussing, each silicon wafer before polishing is taken out of an ingot of silicon monocrystal including As as an impurity of the first conductivity type. In this case, the ingot of silicon monocrystal includes oxygen as an impurity and the concentration of the oxygen has a gradient relative to a pulling direction of the ingot or a direction of crystal growth. A silicon wafer is cut out of a region of the ingot to be used as a sample for breakdown-voltage test of the gate oxide film. A value of the oxygen concentration Oi of the horizontal axis in FIG. 2 indicates a mean value of each cut region of the ingot. The vertical axis of FIG. 2 indicates a voltage applied when the characteristics of the gate oxide film are lost. The film thickness t of the epitaxial growth layer 10 formed in each sample is set to be not more than 20 $\mu$m. In FIG. 2, a sign $\sigma$ represents standard deviation.

It can be seen from FIG. 2 that the oxygen concentration Oi at the time when all the samples exceed the standard value 7 MV/cm is $12 \times 10^{17}$ atoms/cm$^3$.

Figure 3:
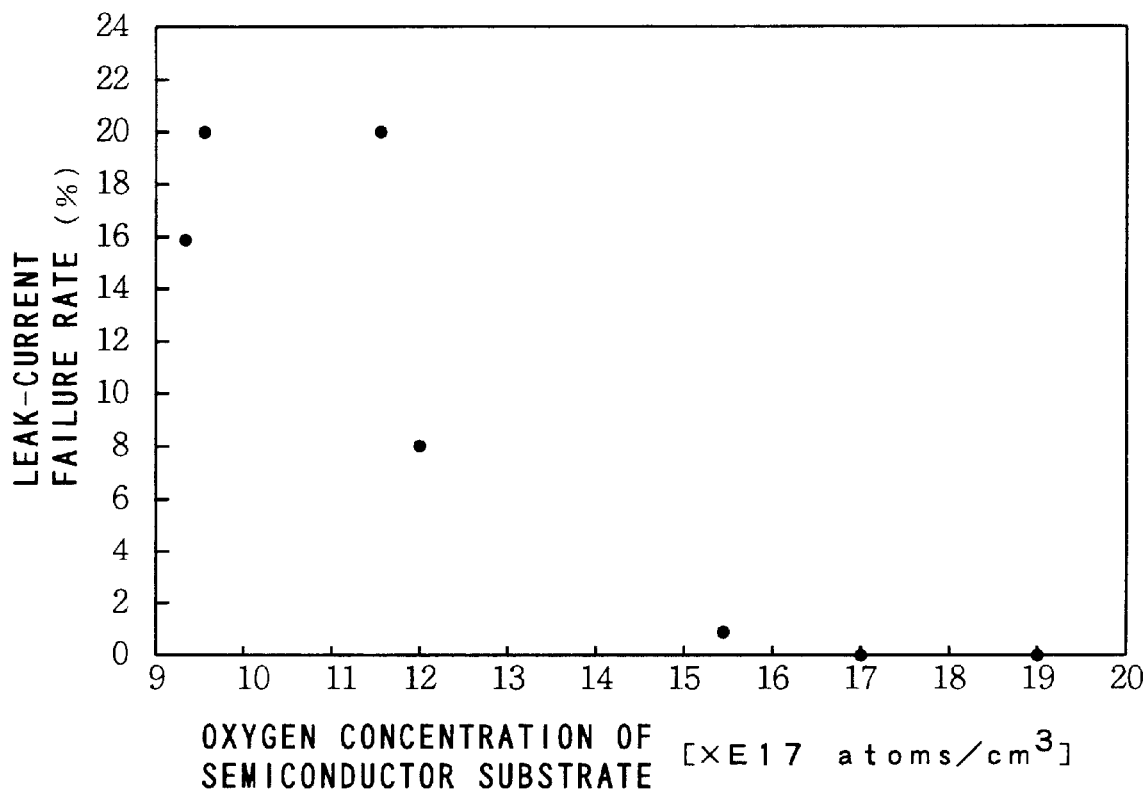
FIG. 3 shows a relation between an oxygen concentration and a current failure rate in a semiconductor substrate.

FIG. 3 shows an experimental result indicating a relation between the oxygen concentration Oi in the semiconductor substrate 1 and the leak-current failure rate, relating to the above-noted problems ① and ②. The horizontal axis of FIG. 3 represents the mean value like that of FIG. 2.

As can be seen from FIG. 3, when the oxygen concentration Oi is set at $12 \times 10^{17}$ atoms/cm$^3$, the leak-current failure rate sharply decreases and the improvement is great. When the oxygen concentration Oi is set higher than that, the leak-current failure rate decreases more sharply towards 0%, and reaches 0% at the oxygen concentration Oi of $17 \times 10^{17}$ atoms/cm$^3$. Therefore, setting the oxygen concentration Oi to be not less than $12 \times 10^{17}$ atoms/cm$^3$ leads to the improvement of the problems ① and ②.

Figure 4:
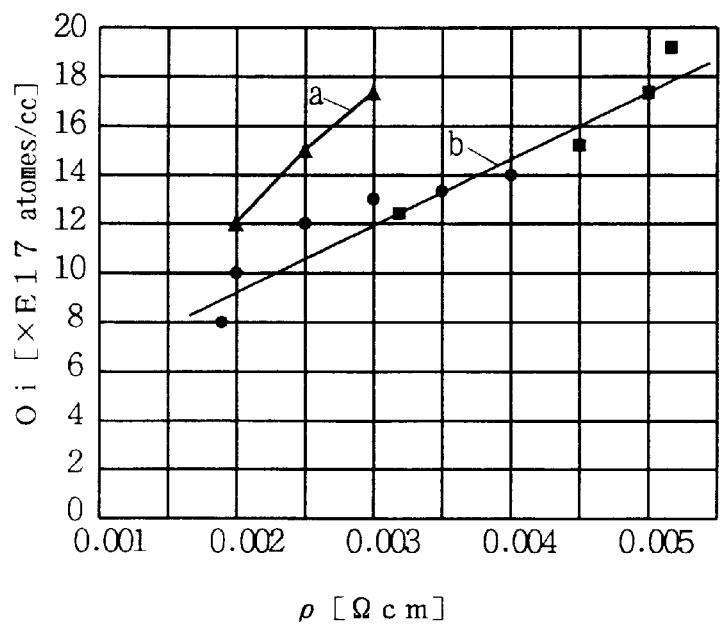
FIG. 4 shows a relation between a resistivity and an oxygen concentration in accordance with the first preferred embodiment of the present invention.

On the other hand, FIG. 4 shows an experimental result indicating a relation between a substrate resistance of the semiconductor substrate 1 and the oxygen concentration Oi thereof. In this experiment, a sample is made of a silicon wafer as a base material including 5 inches of As whose crystal orientation on the wafer surface is a plane (001). In FIG. 4, the horizontal axis represents the resistivity $\sigma$ ($\Omega$ cm) of the semiconductor substrate 1 and the vertical axis represents the oxygen concentration Oi.

In FIG. 4, the difference between the results shown in a and b is caused by the difference of furnaces used for forming the ingots. In the case of sample a, the upper limit of the oxygen concentration Oi to be included in the silicon wafer is regulated to be about 18E17 atoms/cm$^3$ under the state of the art in crystal growth.

It can be seen from FIG. 4 that the bulk resistance of the semiconductor substrate 1 increases in proportion to the oxygen concentration Oi. To restrict the resistivity ρ under 0.006 Ω cm, in other words, to maintain low resistivity of the semiconductor substrate 1, it is desirable that the oxygen concentration Oi is set within 20×10$^{17}$ atoms/cm$^3$. If the lower limit of the oxygen concentration Oi is set to be 12×10$^{17}$ atoms/cm$^3$, the lower limit of the resistivity ρ is 0.002 Ω cm.

Studying the results of FIGS. 2 to 4 synthetically, the appropriate oxygen concentration Oi is in a range of 12E17 atoms/cm$^3$ to 20E17 atoms/cm$^3$. In other words, the oxygen concentration Oi is regulated so that the resistivity ρ of the semiconductor substrate 1 may be in a range of 0.002 Ω cm to 0.006 Ω cm. If the oxygen concentration Oi is controlled to be in the range, the gettering effect can be fully exerted while preventing the increase in resistance of the semiconductor substrate 1 and therefore preventing the increase in ON-resistance.

Thus, when the oxygen concentration of the semiconductor substrate 1 is set in the range of 12E17 (atoms/cm$^3$) to 20E17 (atoms/cm$^3$), the leak-current source and gate-oxide-film breakdown-voltage characteristics deteriorating source such as metal contamination and crystal defect inside the epitaxial growth layer 10 can be gettered by intrinsic gettering effect using the defect in the semiconductor substrate 1. Moreover, at this time, the resistivity of the semiconductor substrate 1 is prevented from increasing to fall within the range of 0.002 Ω cm to 0.006 Ω cm, and therefore the semiconductor substrate 1 of extremely low resistance is achieved. That results in a decrease in ON-resistance of the device as mentioned above. Since the intrinsic gettering effect can be fully exerted without increasing the ON-resistance, no leak current is generated between the drain and source, and therefore a power semiconductor device of excellent characteristics, without deterioration in main breakdown-voltage characteristics and with stable gate-oxide-film breakdown-voltage characteristics, is obtained. As a result, an effect of increasing a yield of the power semiconductor device is achieved.

In this preferred embodiment, As is used as an n-type impurity included in the semiconductor substrate 1. With As, it becomes easier to achieve the semiconductor substrate 1 of very low resistivity (0.002 Ω cm to 0.006 Ω cm). Naturally, the impurity in the semiconductor substrate 1 is not necessarily restricted to As, and the same effect as above can be achieved with other impurity donors.

In this preferred embodiment, the thickness of the epitaxial growth layer 2 is set to be not more than 20 μm. This is based on the following reason and consideration. In terms of the drain-source breakdown voltage, the thickness t is equivalent to the drain-source breakdown-voltage of not more than about 150 V. An advantage of the trench gate over the plane gate is that the channel resistance in a cell of the trench gate is lowered because the channel density of the trench gate is higher. When the drain-source breakdown voltage is low, specifically not more than 150 V, the ratio of the resistance of the epitaxial growth layer 10 to the resistance of the whole device is high and therefore the trench gate structure allows reduction in resistance of the whole device. When the drain-source breakdown voltage is higher than 150 V, however, the resistance of the whole device almost depends on the bulk resistance of the first epitaxial growth layer 2, and therefore the decrease in channel resistance by using the trench gate structure has little contribution to improvement in reduction of the resistance of the whole device. To fully take advantage of the trench gate structure, it is desirable that the breakdown voltage is set to be not more than 150 V, in other words, the thickness t is set to be not more than 20 μm.

Figure 5:
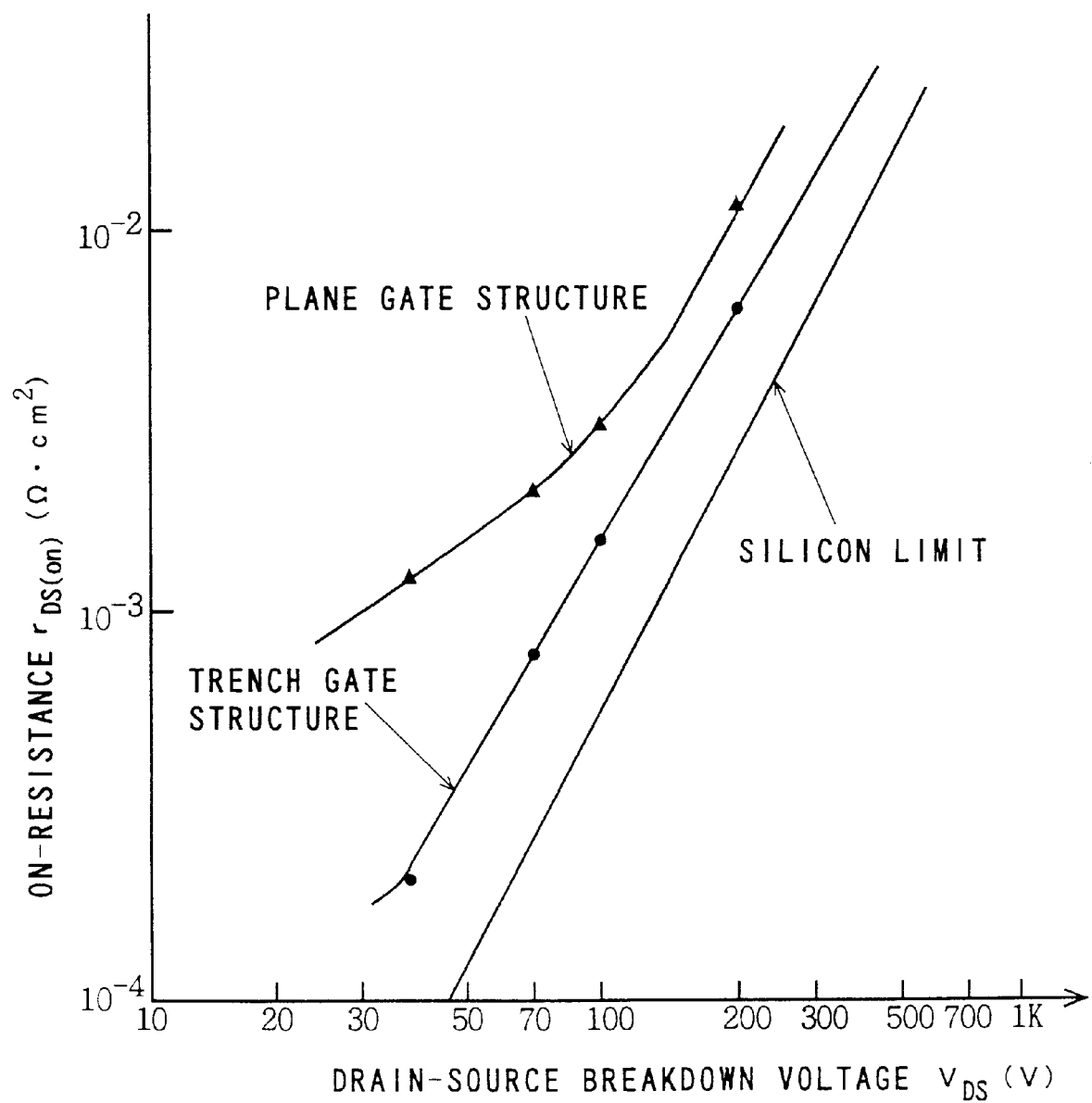
FIG. 5 shows a relation between a drain-source breakdown voltage and an ON-resistance in the vertical MOSFET with trench gate in accordance with the first preferred embodiment of the present invention as compared with a MOSFET with plane gate.

For reference, FIG. 5 shows a relation between the drain-source breakdown voltage and the ON-resistance. The same relation of FIG. 5 is shown in, for example, "Transistor Gijyutsu" (CQ Publishing Corporation Ltd.) of September, 1994. It can be seen from FIG. 5 that the ratio in ON-resistance of the trench gate and plane gate is 1:4 when the drain-source breakdown voltage is 40 V, the ratio is 1:2 when the drain-source breakdown voltage is 100 V, the ratio is 1:1.5 when the drain-source breakdown voltage is 150 V and the ratio is 1:1.5 when the drain-source breakdown voltage is 200 V, and thus the effect to be obtained with the trench gate structure is lowered when the drain-source breakdown voltage is over 150 V. In short, when the trench gate structure is adopted under the condition that the drain-source breakdown voltage is not more than 150 V, in other words, the thickness t of the epitaxial growth layer 10 is not more than 20 μm, the resistance of the whole device can be effectively reduced to improve the characteristics. Thus, it is desirable to set the thickness t to be not more than 20 μm, though the thickness t≦20 μm is not an essential condition.

It is preferable that the silicon wafer as a base material of the semiconductor substrate 1 has an orientation flat whose normal direction is one of two crystal axes perpendicular to a crystal axis which is perpendicular to its surface. When the crystal axes of the silicon wafer and the orientation flat are specified as above and the present power semiconductor device is manufactured with the longitudinal direction of the trench parallel to the normal direction of the orientation flat or parallel to one of other axes perpendicular to the normal direction of the orientation flat, it is possible to make the thickness of the oxide film 5 uniform, which is formed on the side surface 6W and the bottom surface 6B of the trench 6 serving as a gate and further improve the breakdown-voltage characteristics of the gate oxide film. In this point, discussion will be made with a comparison between the FIGS. 6A and 6B and FIGS. 7A and 7B.

Figure 6A:
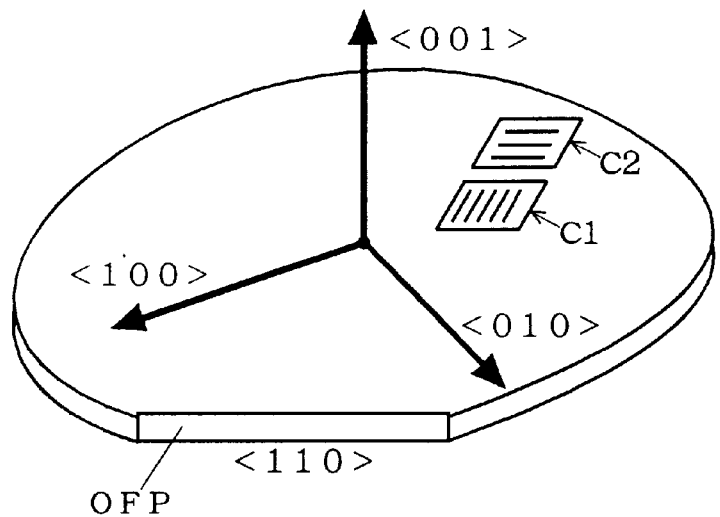
FIGS. 6A and 6B show a relation between a crystal orientation of a semiconductor substrate and a forming direction of a trench in the background art.
Figure 6B:
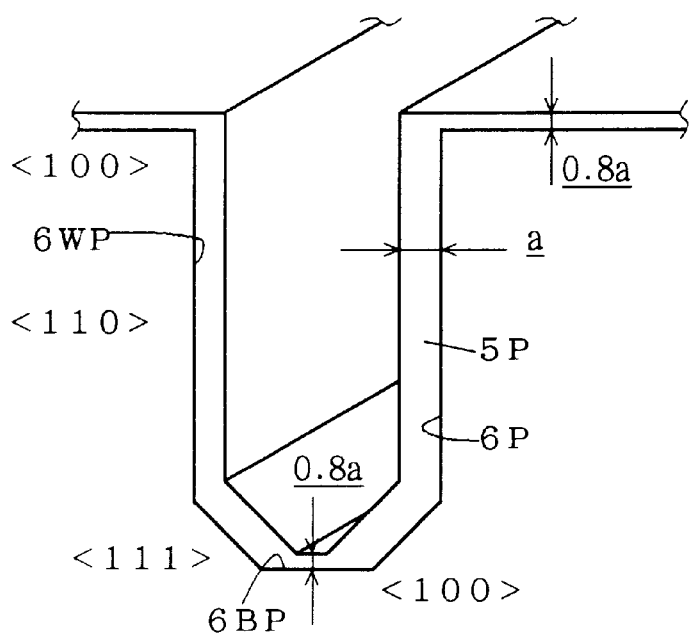

FIG. 6A shows a base material of the MOSFET with trench gate and a relation between the crystal axes of the silicon wafer and the orientation flat OFP generally used in the background art while FIG. 6B is a schematic enlarged view of the trench gate structure formed so as to have the longitudinal direction of the trench in a direction <110> in the wafer of FIG. 6A. In this case, the degree of coupling of hands of the silicon atoms varies with the crystal surface and therefore the film thickness of the oxide film 5P is nonuniform. For example, assuming that the thickness of the oxide film 5P on the side surface 6WP of the trench is a, the thickness of the oxide film 5P on the bottom surface 6BP is 0.8a, which is thinner. When the film thickness is nonuniform, the resistance to pressure is deteriorated locally at a thin portion and the breakdown-voltage characteristics of the oxide film are deteriorated on the whole.

Figure 7A:
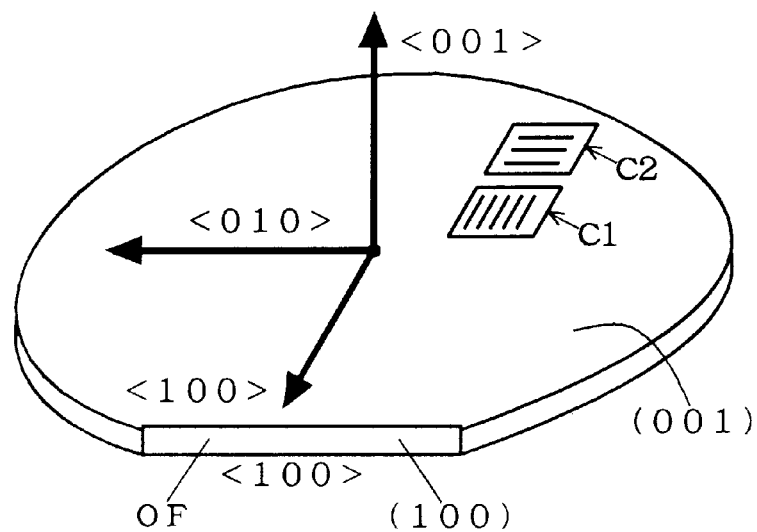
FIGS. 7A and 7B show a relation between a crystal orientation of a semiconductor substrate and a forming direction of a trench in accordance with the first preferred embodiment of the present invention.
Figure 7B:
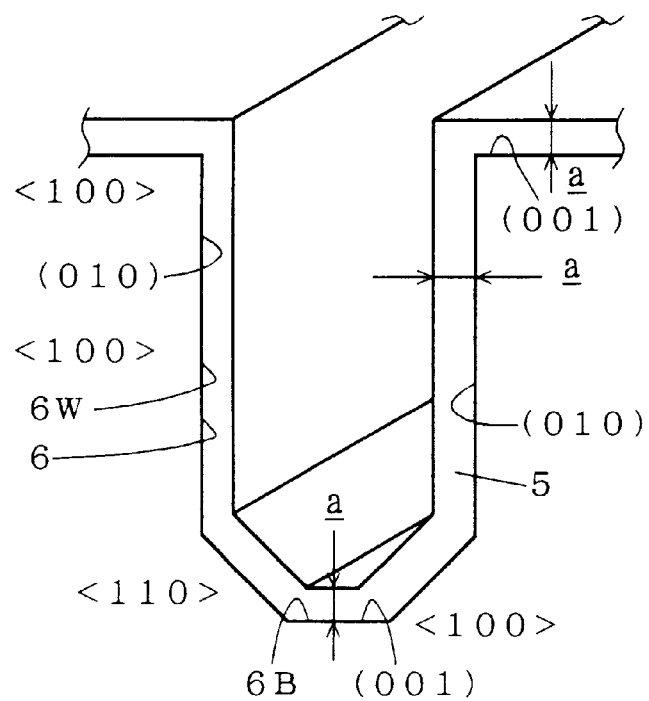

On the other hand, when the silicon wafer of FIG. 7, whose crystal orientation of surface is a plane (001) and crystal orientation of orientation flat OF is a plane (100), is used as the base material of the semiconductor substrate 1 of FIG. 1, the oxide films 5 on the well surface 6W and the bottom surface 6B of the trench 6 each have the film thickness of a as shown in FIG. 7B and it is possible to effectively prevent the film thickness from being locally thinner. In this case, the trench 6 may be formed so that its longitudinal direction should be parallel to a direction <100> as represented by C1 of FIG. 7A or may be formed so that its longitudinal direction should be parallel to a direction <010> as represented by C2 of FIG. 7A. The former case is shown in FIG. 7B.

Thus, it is possible to effectively utilize the crystal orientation of the orientation flat in mask alignment.

Since the silicon monocrystal is cubic, the silicon wafer having a relation equivalent to the orientational relation of FIG. 7A achieves the same effect.

As discussed above, it is preferable that the vertical MOSFET of FIG. 1 should be formed in the silicon wafer of FIG. 7A so that the longitudinal direction of the trench may be parallel to the normal direction of the plane formed as the orientation flat or parallel to the crystal axis included in the wafer surface perpendicular to the normal direction of the plane formed as the orientation flat. Also when a general silicon wafer of FIG. 6A is used, the same effect as discussed with reference to FIGS. 1 to 4 can be achieved and the silicon wafer of FIG. 6A may be used. In this point, using the silicon wafer of FIG. 7A as a base material is not an essential requirement of the present invention.

The technique for determining the longitudinal direction of the trench parallel to the direction <100> is disclosed in Japanese Patent Application Laid Open Gazette 4-47988.

Thus, with the semiconductor substrate 1 of very low resistivity (in the range of 0.002 Ω cm to 0.006 Ω cm) including the oxygen of optimum concentration (in the range of 12E17 atoms/cm$^3$ to 20E17 atoms/cm$^3$) and the layer 10 generated by epitaxial growth on the surface of the semiconductor substrate 1, the intrinsic gettering effect can be fully exerted while ensuring optimum ON-resistance, whereby it is possible to prevent generation of drain-source leak current and deterioration of the breakdown-voltage characteristics of the gate oxide film. Therefore, it also becomes possible to provide a method for manufacturing a power semiconductor device which allows a great improvement in yield. The method will be discussed in the second preferred embodiment below.

The technical concept of the first preferred embodiment is applicable not only to the vertical MOSFET with trench gate of FIG. 1 but also to other power device such as a vertical MOSFET with plane gate and a diode, and further applicable to a structure where the first conductivity type is p type and the second conductivity type is n type, instead of the structure of FIG. 1.

The Second Preferred Embodiment

In the second preferred embodiment, discussion will be made on a method for manufacturing the vertical MOSFET with trench gate which is an example of the power semiconductor device in accordance with the first preferred embodiment of the present invention.

Figure 8:
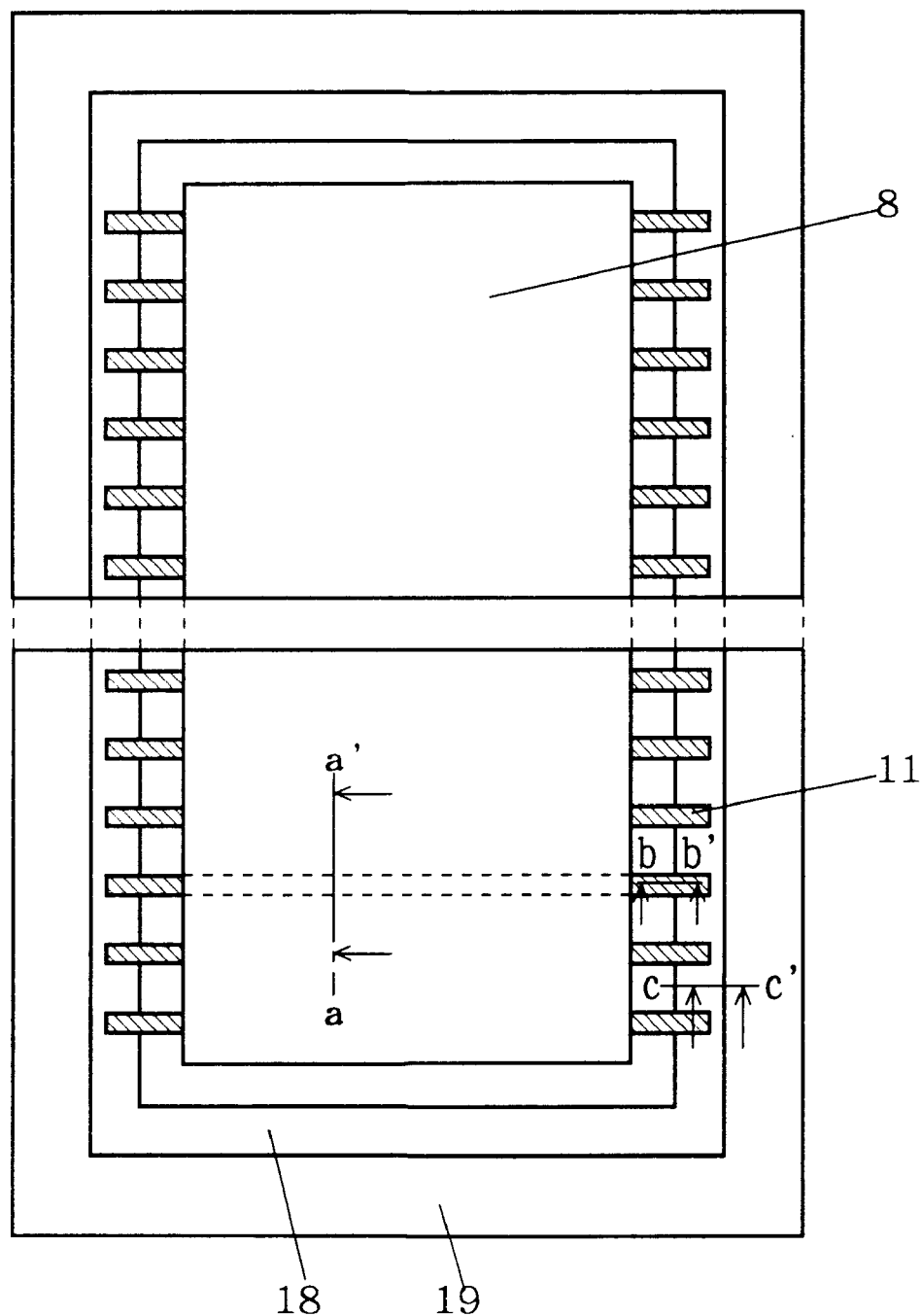
FIG. 8 is a plan view of a vertical MOSFET with trench gate in accordance with a second preferred embodiment of the present invention.

FIG. 8 is a plan view showing a state where a plurality of vertical MOSFETs with trench gate are formed on the semiconductor substrate whose base material is silicon wafer, and FIGS. 9A, 9B and 9C as referred to later are cross sections taken along the lines a–a', b–b' and c–c' of FIG. 8 and portions in these figures are referred to as a cell portion, a drawing portion and a peripheral portion, respectively. The same applies to FIGS. 10A to 10C, 11A to 11C, 12A to 12C and 13A to 13C as referred to later in terms of A, B and C, Further, in the MOSFET of the second preferred embodiment, by forming a field plate structure at the drawing portion and the peripheral portion where a plurality of MOSFETs are formed, an electric filed at an end of a depletion layer near the fourth major surface 3S2 described later is relieved, to ensure high breakdown voltage for a power semiconductor device. Specifically, a p-type layer 13, an oxide film 15 and the conductive layer 11 of FIGS. 13B and 13C discussed later constitute a field plate structure to ensure high breakdown voltage.

FIG. 8 shows a gate layer 18 and an aluminum line 19 connecting the gate layer 18 and an external control circuit.

The First Step

In the first step, the semiconductor substrate 1 (see FIG. 1) of the first conductivity type having the oxygen concentration in the range of 12E17 atoms/cm$^3$ to 20E17 atoms/cm$^3$ is prepared. The impurity concentration of the semiconductor substrate 1 is higher than that of the first epitaxial growth layer 2 (see FIG. 1) of the first conductivity type as discussed later, and the resistivity of the semiconductor substrate 1 is set to be not more than 0.006 Ω cm. The semiconductor substrate 1 is a wafer having the crystal orientation of FIG. 7A and the longitudinal direction of the trench formed in a later step is specified as the direction of FIG. 7B. Though the first conductivity type is n type and the semiconductor substrate 1 includes As (arsenic) as an impurity (donor) of the first conductivity type in the second preferred embodiment, other n-type impurities such as P (phosphorus) may be used.

The second step

The second step is a step for forming an epitaxial growth layer of the first conductivity type on the major surface of the semiconductor substrate 1.

Figure 9A:
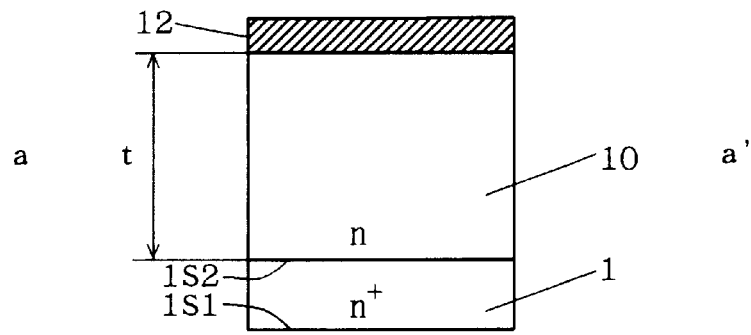
FIGS. 9A to 9C, 10A to 10C, 11A to 11C, 12A to 12C and 13A to 13C are cross sections showing steps of manufacturing a vertical MOSFET with trench gate in accordance with the second preferred embodiment of the present invention.
Figure 9B:
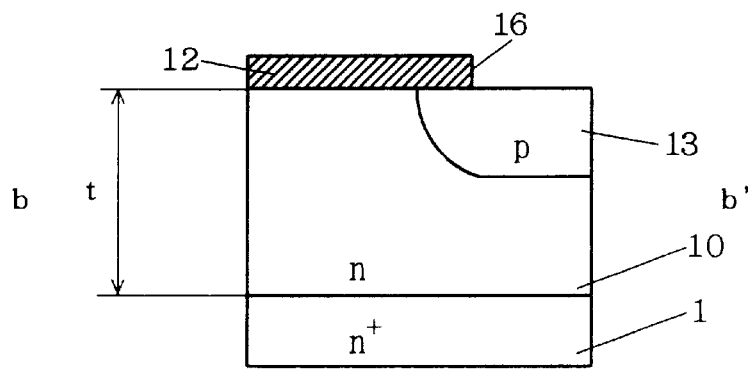
Figure 9C:
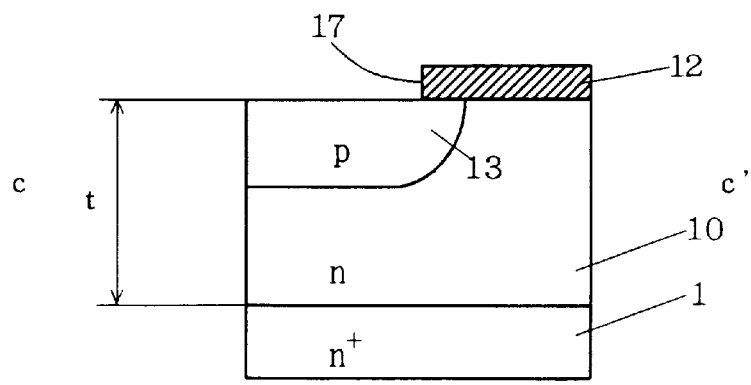

As shown in FIGS. 9A to 9C, the epitaxial growth layer 10 of the first conductivity type is formed by epitaxial growth on the second major surface 1S2 of the semiconductor substrate 1. The film thickness t of the epitaxial growth layer 10 is set to be not more than 20 μm.

Further, as shown FIGS. 9A to 9C, an oxide film 12 is formed by thermal oxidation on the surface of the epitaxial growth layer 10 and thereafter openings 16 and 17 are selectively formed by a photolithography technique. The p-type layer 13 of the second conductivity type is formed to a predetermined depth at the trench drawing portion of FIG. 9B and the peripheral portion of FIG. 9C by an ion implantation technique using the openings 16 and 17. In forming the p-type layer 13, B (boron) is used as an impurity of the second conductivity type. The concentration of the p-type layer 13 is set lower than the impurity concentration of the diffusion layer 3 as discussed later.

The Third Step

In the third step, an impurity of the second conductivity type is formed so as to extend from the surface of the epitaxial growth layer 10 to the inside thereof, to obtain the first epitaxial growth layer 2 (see FIG. 1) of the first conductivity type and the diffusion layer 3 of the second conductivity type. Further, the trench 6 is formed so as to extend from the surface of the diffusion layer 3 (see FIG. 1) to the inside of the first epitaxial growth layer 2 and the oxide film 5 (see FIG. 1) is formed entirely on the bottom surface 6B and the wall surface 6W of the trench 6 (see FIG. 1). Specifically, the above formations are carried out as follows.

Figure 10A:
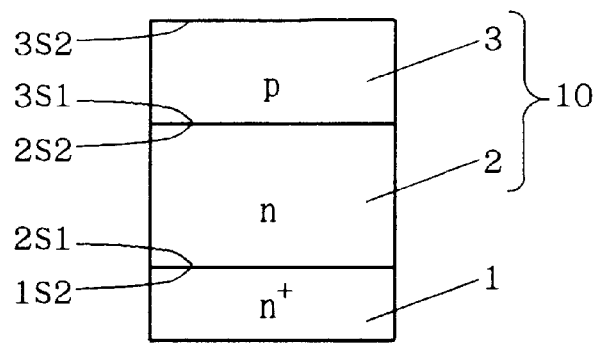
Figure 10B:
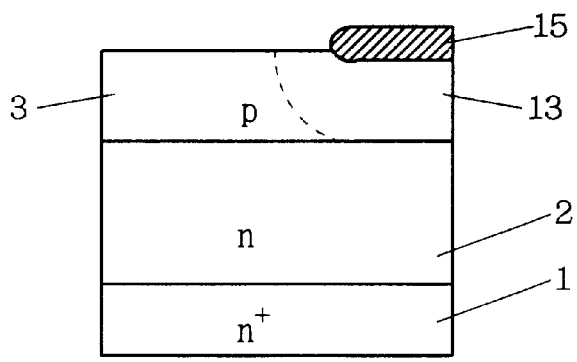

The oxide film 12 in the cell portion and drawing portion of FIGS. 9A and 9B is removed as shown in FIGS. 10A and 10B.

Figure 10C:
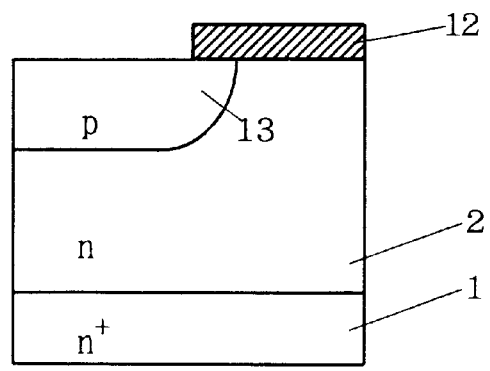

Next, an impurity of the second conductivity type, e.g., B (boron), is implanted and diffused from the surface of the epitaxial growth layer 10 to the inside thereof, to form the diffusion layer 3 of the second conductivity type to a predetermined depth as shown in FIGS. 10A to 10C. When the above epitaxial growth layer of the first conductivity type is termed the first epitaxial growth layer 2, the diffusion layer of the second conductivity type may be defined as the second epitaxial growth layer 3 in consideration that the diffusion layer of the second conductivity type is formed by using the epitaxial growth layer as the base material. In short, the epitaxial growth layer 10 in the following discussion includes the first epitaxial growth layer 2, the diffusion layer 3 and the p-type layer 13. The first major surface 2S1 of the first epitaxial growth layer 2 is the first interface with the second major surface 1S2 of the semiconductor substrate 1 while the second major surface 2S2 of the first epitaxial growth layer 2 opposed to the first major surface 2S1 is the second interface with the third major surface 3S1 of the diffusion layer 3.

Further, the thick oxide film 15 is formed on the p-type layer 13 in the drawing portion as shown in FIG. 10B.

Figure 11A:
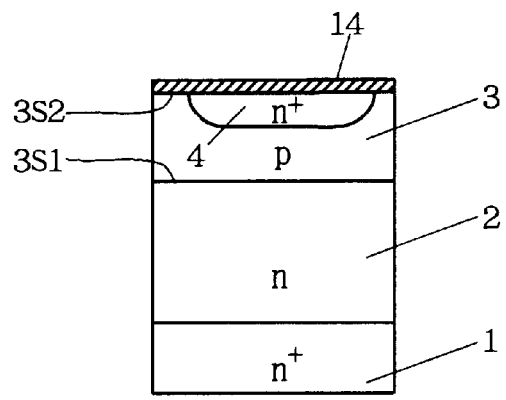
Figure 11B:
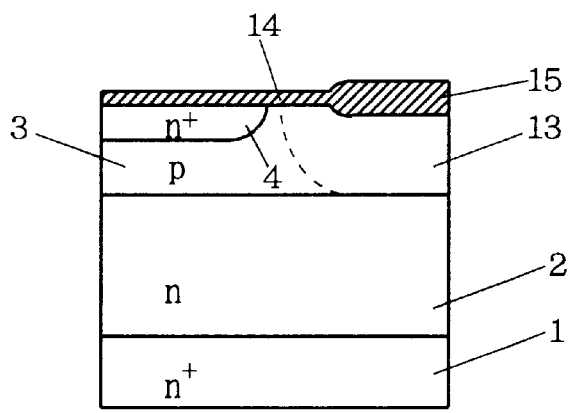
Figure 11C:
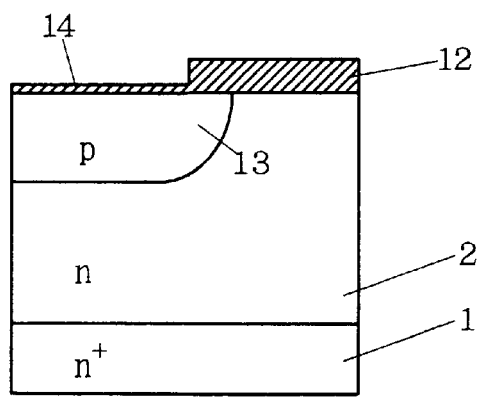

Subsequently, as shown in FIGS. 11A to 11C, an n-type impurity of high concentration, e.g., As (arsenic), is selectively implanted into the surface of the diffusion layer 3, specifically, the fourth major surface 3S2 of the diffusion layer 3 opposed to the third major surface 3S1, by a photolithography technique, to form the source layer 4 not in contact with the first epitaxial growth layer 2 to the predetermined depth. After that, an oxide film 14 is formed on the surface of the epitaxial growth layer 10.

The trench 6 is formed so as to extend from the fourth major surface 3S2 of the diffusion layer 3 towards the inside thereof as follows.

Figure 12A:
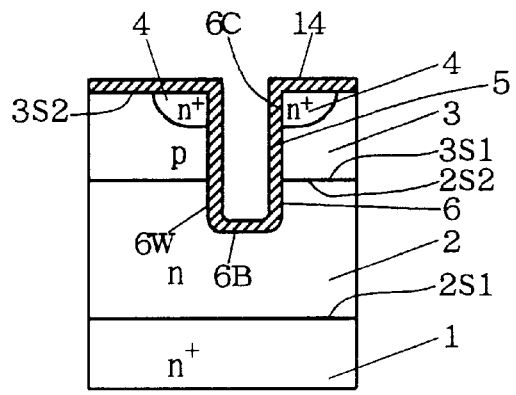
Figure 12B:
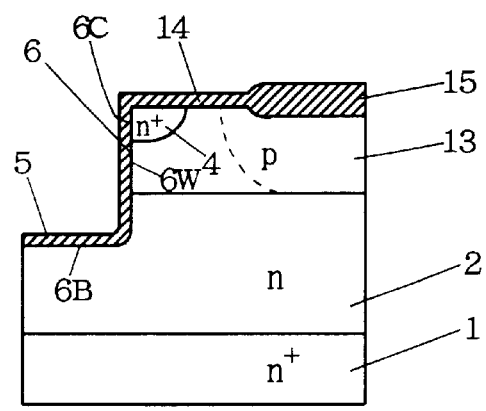
Figure 12C:
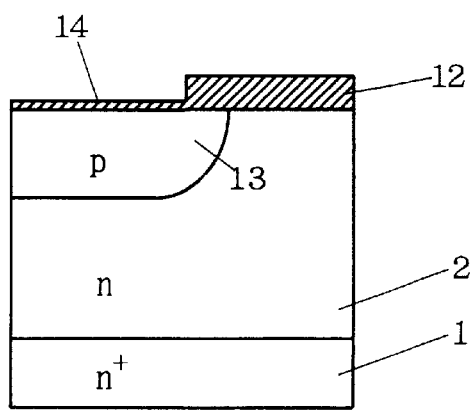

Specifically, as shown in FIGS. 12A to 12C, the trench 6 is selectively formed from the fourth surface 3S2 of the diffusion layer 3 to the inside of the first epitaxial layer 2 across the second interface by a photolithography technique and a dry etching technique. At this time, the trench 6 is formed in such a form as to separate the source layer 4, but the source layer 4 is still left at the corner 6C of the trench 6 in the second epitaxial growth layer 3.

Further, as shown in FIGS. 12A and 12B, the gate oxide film 5 made of an $SiO_2$ film is formed entirely on the bottom surface 6B and the wall surface 6W surrounding the bottom surface 6B of the trench 6.

The Fourth Step

Figure 13A:
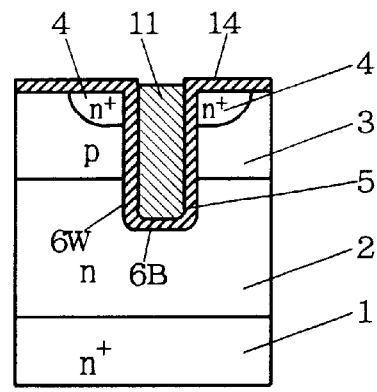
Figure 13B:
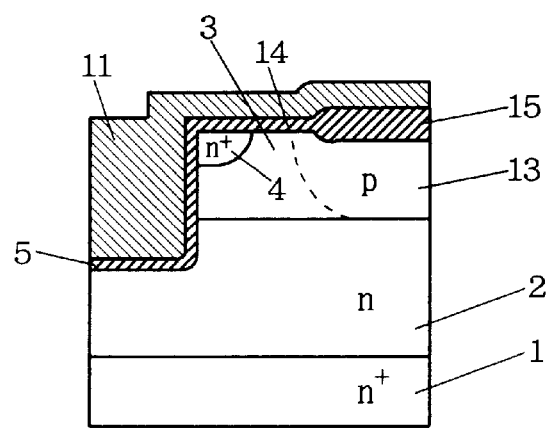
Figure 13C:
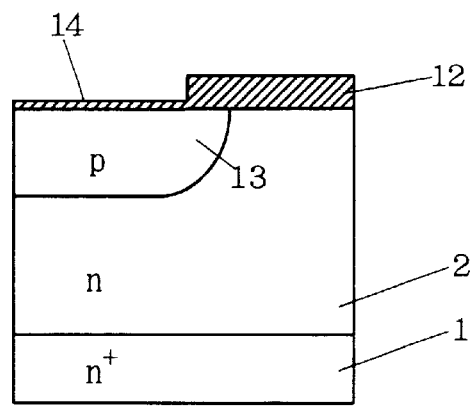

In the fourth step, as shown in FIGS. 13A and 13B, the trench buried layer 11, which is a conductive layer, is provided over and on the surface of the oxide film 5 to fill the trench 6. At this time, as shown in FIG. 13B, the conductive layer 11 is formed so as to extend from the trench 6 to the oxide films 14 and 15 in the drawing portion, being connected to the gate electrode (not shown). Furthermore, a metal, such as aluminum, may be used as the conductive layer 11 though a polycrystalline silicon containing a high concentration of impurity of the first conductivity type is used in the present invention.

Next, an oxide film is formed so as to cover an exposed upper surface of the conductive layer 11, forming a united body with the oxide films 14 and 15. Further, though not shown, the interlayer insulating layer 9 (see FIG. 1), such as PSG, is formed on the unified oxide film 14. Subsequently, the oxide film 14 and the interlayer insulating film 9 other than those on the conductive layer 11 and part of the source layer 4 are removed by a photolithography technique and an etching technique to expose the other portion of the fourth major surface 3S2. The source electrode 8 (see FIG. 1) is formed so as to cover the exposed portion of the fourth major surface 3S2 and the interlayer insulating film 9, and the drain electrode 7 (see FIG. 1) is formed on the first major surface 1S1 of the semiconductor substrate 1. Thus, the vertical MOSFET with trench gate in the present invention of FIG. 1 is completed.

In the first to fourth steps, the intrinsic gettering step is not specified as an independent step. The reason is as follows.

For example, the step of forming the p-type layer 13 in the second step includes a heat treatment at 1200° C. for an hour after implantation of the p-type impurity of the second conductivity type. Similarly, the step of forming the diffusion layer 3 in the third step includes a heat treatment at 1100° C. for two hours. Thus, in the first and fourth steps, high-temperature heat treatment steps are carried out. The intrinsic gettering step utilizes the heat treatment step and actively and effectively uses usable steps in the manufacturing process. Thus, practicality and general versatility of the intrinsic gettering step can be achieved with no additional independent step.

In the manufacturing method of the second preferred embodiment, since the epitaxial growth layer of the first conductivity type and the diffusion layer of the second conductivity type (p type) are formed on the semiconductor substrate containing a high concentration of impurity of the first conductivity type (n type) and the semiconductor substrate has an oxygen concentration in the range of 12E17 atoms/cm$^3$ to 20E17 atoms/cm$^3$ and its resistivity is set to be not more than 0.006 Ω cm, the intrinsic gettering effect is fully exerted in the heat treatment step of the manufacturing process and it becomes possible to fully reduce the metal contamination and the crystal defect generated inside the epitaxial growth layer. Thus, the leak current to be generated inside the epitaxial growth layer is fully reduced, whereby a semiconductor device of new structure which prevents deterioration of the main breakdown voltage can be manufactured.

Further, according to the manufacturing method of the second preferred embodiment, a semiconductor device having a trench on a semiconductor substrate having an epitaxial growth layer as set forth above, it is possible to stabilize the oxide-film breakdown-voltage characteristics along with the above effect, and therefore a semiconductor device which takes full advantage of the trench structure can be manufactured.

Though the above discussion as to the second preferred embodiment is made relative to an n-type epitaxial growth layer being grown on an n-type silicon substrate of high concentration, naturally, the present invention can be applied where a p-type epitaxial growth layer is grown on a p-type silicon substrate of high concentration, and in this case, the same effect can be achieved.

While the invention has been shown and described in detail, the foregoing description is in all aspects illustrative and not restrictive. It is therefore understood that numerous modifications and variations can be devised without departing from the scope of the invention.

We claim:

1. A power semiconductor device, comprising:
   a semiconductor substrate comprising an impurity of a first conductivity type and oxygen;
   an epitaxial growth layer comprising a first major surface being a first interface with a major surface of said semiconductor substrate and a second major surface opposed to said first major surface; and
   a semiconductor layer of a second conductivity type comprising a third major surface being a second interface with said second major surface of said epitaxial growth layer and a fourth major surface opposed to said third major surface,
   wherein the concentration of said oxygen is set to be not less than 12E17 atoms/cm$^3$.

2. The power semiconductor device of claim 1, further comprising:

a trench formed so as to extend from said fourth major surface of said semiconductor layer through said second interface to the inside of said epitaxial growth layer; and an oxide film formed entirely on a bottom surface and a wall surface of said trench.

3. The power semiconductor device of claim 2, wherein said concentration of said oxygen is set to be not more than 20E17 atoms/cm$^3$.

4. The power semiconductor device of claim 2, wherein an upper limit of said concentration of said oxygen is specified so that the resistivity of said semiconductor substrate may be not more than 0.006 Ω.cm.

5. The power semiconductor device of claim 1, wherein said impurity in said semiconductor substrate is As.

6. The power semiconductor device of claim 1, wherein a sum of the thickness of said epitaxial growth layer and the thickness of said semiconductor layer is set to be not more than 20 μm.

7. The power semiconductor device of claim 1, wherein said semiconductor substrate comprises a silicon wafer as base material comprising an orientation flat, a surface of said silicon wafer is said major surface of said semiconductor substrate, said orientation flat has a normal direction which is one of crystal axes perpendicular to a crystal axis in a normal direction of said surface of said silicon wafer, and a longitudinal direction of said trench is parallel to said normal direction of said orientation flat.

8. The power semiconductor device of claim 1, wherein said semiconductor substrate comprises a silicon wafer as base material comprising an orientation flat, a surface of said silicon wafer is said major surface of said semiconductor substrate, said orientation flat has a normal direction which is one of crystal axes perpendicular to a crystal axis in a normal direction of said surface of said silicon wafer, and a longitudinal direction of said trench is parallel to the other of said crystal axes perpendicular to said normal direction of said orientation flat.

9. A power semiconductor device, comprising:

a semiconductor substrate comprising arsenic and oxygen as impurities;

an epitaxial growth layer formed on a major surface of said semiconductor substrate and having a thickness of not more than 20 μm;

a trench formed so as to extend from a surface of said epitaxial growth layer to the inside thereof; and an oxide film formed entirely on a bottom surface and a wall surface of said trench, wherein said epitaxial growth layer comprises
a first epitaxial growth layer of a first conductivity type formed on said major surface of said semiconductor substrate; and
a diffusion layer of a second conductivity type formed to be diffused in said first epitaxial growth layer,
and wherein the concentration of said oxygen is set so that a resistivity of said semiconductor substrate is in a range of 0.002 Ω.cm to 0.006 Ω.cm.

* * * * *